United States Patent
Brokaw

[19]

[11] Patent Number: 5,821,741
[45] Date of Patent: Oct. 13, 1998

[54] TEMPERATURE SET POINT CIRCUIT AND METHOD EMPLOYING ADJUSTMENT RESISTOR

[75] Inventor: A. Paul Brokaw, Burlington, Mass.

[73] Assignee: Analog Devices, Inc., Norwood, Mass.

[21] Appl. No.: 796,638

[22] Filed: Feb. 7, 1997

[51] Int. Cl.⁶ .................................................. G05F 3/08
[52] U.S. Cl. ........................ 323/311; 323/315; 323/907
[58] Field of Search ................................ 323/311, 312, 323/313, 314, 315, 369, 907

[56] References Cited

U.S. PATENT DOCUMENTS

| | | | |
|---|---|---|---|
| 4,313,083 | 1/1982 | Gilbert et al. | 323/313 |
| 4,362,984 | 12/1982 | Holland | 323/313 |
| 4,475,103 | 10/1984 | Brokaw et al. | 330/256 |
| 4,864,162 | 9/1989 | Maoz | 323/314 |
| 5,394,078 | 2/1995 | Brokaw | 323/907 |
| 5,519,308 | 5/1996 | Gilbert | 323/313 |
| 5,563,504 | 10/1996 | Gilbert et al. | 323/314 |
| 5,672,961 | 9/1997 | Entrikin et al. | 323/315 |

*Primary Examiner*—Jeffrey L. Sterrett
*Attorney, Agent, or Firm*—Koppel & Jacobs

[57] ABSTRACT

A temperature set point circuit employs a pair of bipolar transistors operated at unequal current densities, with the difference between the transistors' base-emitter voltages appearing across a trim resistor connecting their emitters. A pair of trim resistors, one of which may be external to an integrated circuit embodiment of the set point circuit, forms a resistor divider with the inter-base resistor and are selected to produce a desired temperature trip-point.

3 Claims, 2 Drawing Sheets

TEMPERATURE SET POINT CIRCUIT AND METHOD EMPLOYING ADJUSTMENT RESISTOR

BACKGROUND OF THE INVENTION

1. Field of the Invention

This invention relates to temperature sensing electronic circuits and, in particular, to circuits which feature a temperature "trip point", i.e., circuits which produce an output signal that changes state at a predetermined temperature.

2. Description of the Related Art

Conventional integrated circuit temperature switches and set point controllers which provide a temperature output signal when a preset temperature is reached suffer from a number of shortcomings. The temperature set point may vary due to a variety of manufacturing variables such as sheet resistance variations, current density errors, and variations in the transistor base-to-emitter voltages from lot to lot. In some cases the transistors which determine the set point have their collectorbase voltages subject to the supply voltage so that fluctuations in the supply voltage cause changes to the temperature set point due to the Early effect. In addition, attempts to make such devices easily externally programmable have met with indifferent success because of the inability to account for various fabrication variables; some require two or more external resistors for set point programming.

Such conventional devices typically operate by comparing a proportional to absolute temperature (PTAT) signal to a constant, reference, signal.

SUMMARY OF THE INVENTION

The invention relates to the comparison of proportional to absolute and complimentary to absolute temperature (PTAT and CTAT, respectively) signals to develop a set point signal. The circuit generates PTAT and CTAT signals and trips when the CTAT and PTAT signals are equal or are separated by a predetermined offset.

In a preferred embodiment a single adjustable resistor is employed to determine the circuit set point. For convenience, the trim resistor value may be determined using a process which approximates a logarithmic expression for the trim resistor value by a polynomial express.

In one embodiment, the invention features a resistor programmable temperature switch for indicating whether the integrated circuit's temperature is either less than, or greater than or equal to a preselected trip temperature. In a preferred embodiment bipolar transistors of like polarity (e.g. NPN or PNP) are operated at unequal current densities thereby establishing a $\Delta V_{BE}$ signal which is PTAT. A bipolar transistor's base emitter voltage is employed as the basis for the CTAT signal.

These and other features and advantages of the invention will be apparent to those skilled in the art from the following detailed description, taken with the accompanying drawings.

DETAILED DESCRIPTION OF THE INVENTION

Figure 1:
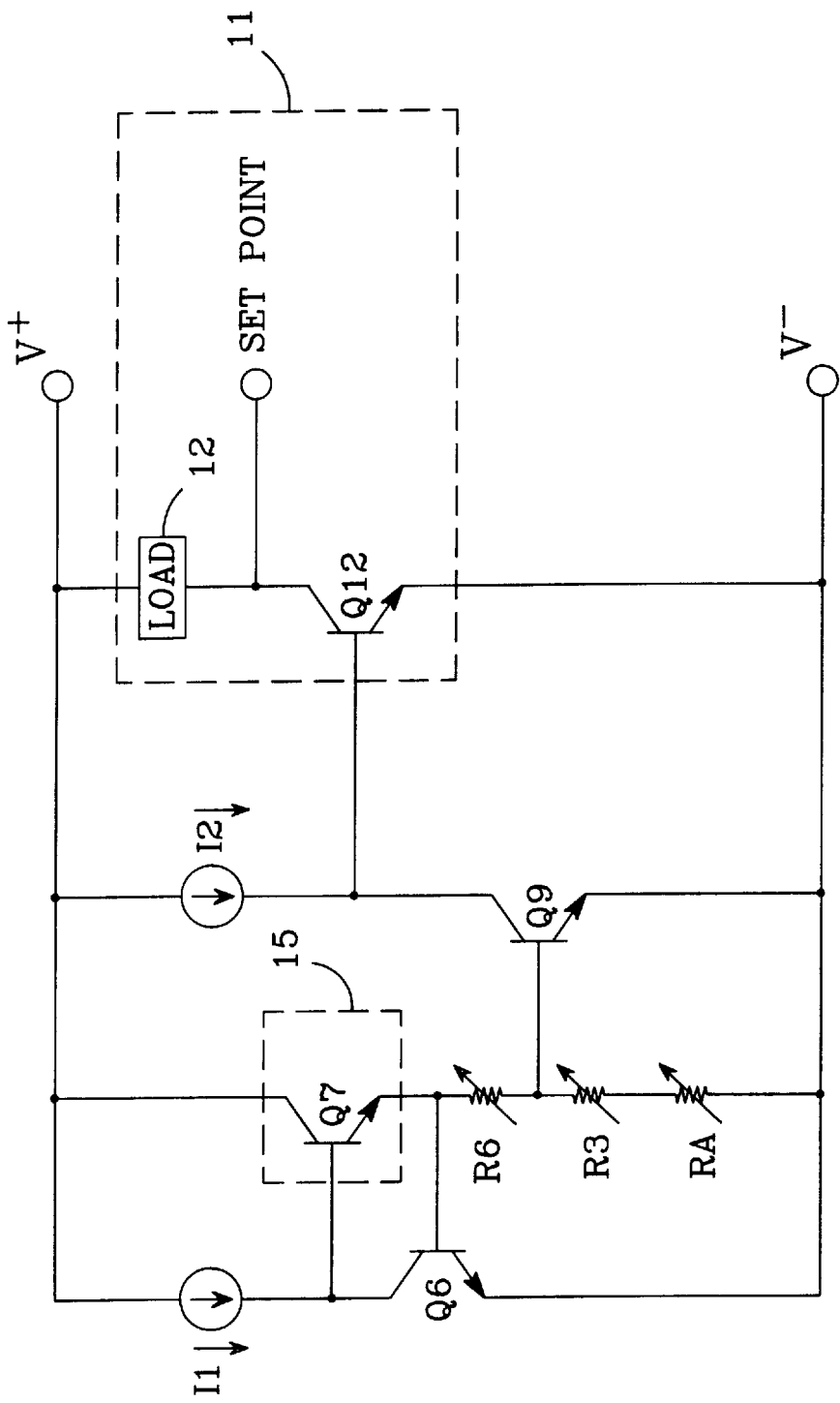
FIG. 1 is a circuit diagram of a preferred embodiment of the new trip point temperature sensor.

FIG. 1 illustrates a resistor programmable temperature switch according to the invention which includes first and second transistors Q6 and Q9 of similar, e.g., NPN, polarity. Transistors Q6 and Q9 operate at constant, unequal, current densities. In the illustrated preferred embodiment, this is achieved by employing transistors having ratioed emitter areas.

The collector of transistor of Q6 is connected through a current source I1 to a positive supply terminal V+. The current source I1 typically supplies a current of 10 microamps at room temperature and the supply terminal V+ may be operated at extremely low voltage, e.g., 2 volts, with respect to a negative supply terminal V−. The emitter of transistor Q6 is connected to the negative supply terminal V−. Bipolar transistor Q9 which has an emitter area N times that of transistor Q6 is connected at its emitter to the negative supply terminal V−. The collector of transistor Q9 is connected through a current source labelled I2, typically 5 microamps, to the positive supply terminal V+. A startup circuit 15 provides base current to the transistor Q6. In the preferred embodiment, this startup circuit employs a third transistor Q7 which has its base connected to the collector of transistor Q6, its collector connected to the positive supply terminal V+ and its emitter is connected to the base of transistor Q6.

A voltage divider comprising resistors R6 and R3a (including R3 and RA) is also connected to the base of transistor Q6 at one end and to the negative supply terminal V− at the other end. The resistor R6 is a trimming resistor which is trimmed to adjust for variations in sheet resistance, in current density ratio errors. The difference between base-emitter voltages of the transistors Q6 and Q9 appears across resistor R6. The resistor R3 is selected to compensate for errors in its own sheet resistance as well as other manufacturing variations such as variations in the intrinsic base emitter voltages of transistors Q6 and Q9. A portion of resistor R3a, RA, may be disposed externally for adjusting the set point of the switch 10 independent of manufacturing variations. An output stage 11 includes a fourth transistor Q12 with its emitter connected to the negative supply terminal V− and its base connected to the collector of transistor Q9. The collector of transistor Q12 is connected through a load 12 to the positive supply terminal V+, the collector of Q12 provides the set point output signal labelled SETPOINT.

The current source I1 and transistors Q7 and Q6 operate to establish the base emitter voltage of transistor Q6 at a nominal value. The voltage divider comprising resistors R6, R3 and RA provides the base bias for transistor Q9 which has the current I2 available as collector current. At low temperatures most of this current is diverted to the output stage 11, the base of transistor Q12 in the illustrated embodiment, causing it to be on and to drive its load.

The way the set-point circuit's comparator function is achieved can be seen by noting that the emitters of transistors Q6 and Q9 are connected, so that the difference in the base voltages operates them as a differential pair, albeit one with no common mode compliance. If transistors Q6 and Q9 are the same size and current I1 was equal to current I2, the collector current should balance and transistor Q9 should just conduct all of I2 when the base voltages were equal. Since transistor Q9 is larger than transistor Q6 by a factor of 8 in the preferred embodiment and current I2 is smaller than current I1 by a factor of 2, the equilibrium condition where transistor Q9 just conducts all of current I2 will occur when the two base voltage differ in the amount:

$$\Delta VBE = (kT/q)\ln(NI1/I2) \quad (1)$$

where N is the emitter area ratio, 8 in the preferred embodiment, ln is the natural logarithm function, k is Boltzmann's constant, T the temperature Kelvin, and q the electron charge. Equation 1 expresses the voltage across R6 required to cause transistor Q9 to just take the last of current I2 away from the base of transistor Q12. The actual voltage across resistor R6 is a fraction of the base emitter voltage of transistor Q6 so that this condition depends on the ratio of the resistors and the temperature. The voltage across R6 may be expressed as a function of the base emitter voltage of transistor Q9. At all temperatures T we can express $V_{BE(9)}$ as:

$$VBE(9)=VGO-[(T(VGO-VBEO(9))/T0]+(kT/q)\ln(Ic/Io)+(mkT/q)\ln(To/T) \quad (2)$$

where $V_{GO}$ is the bandgap energy extrapolated to zero degrees K, $T_0$ is a more convenient temperature for measurement, $V_{BEO(9)}$ is the base emitter voltage of transistor Q9 at this temperature when operated with $I_0$ in the collector, $I_c$ is the present operating current, m is a curvature constant and k and q are Boltzmann's constant and electron charge, respectively.

Neglecting base currents, the base emitter voltage of transistor Q9 divided by the sum of resistors R3 and RA should give the current in resistor R6 as well, so that at the trip temperature we can assert:

$$(R3A/R6)(kT/q)\ln(NI1/I2)=VGO-[(T(VGO-VBEO(9))/T0]+(kT/q)\ln(I2/Io)+(mkT/q)\ln(To/T) \quad (3)$$

by equating equation 1 to equation 2 multiplied by the resistor ratio, and rearranging. Since the current I2 is PTAT, $I_0 T/T_0$ can be substituted for I2 on the right side of the equation, allowing the last two terms to be combined, yielding;

$$R3A=R6[q/(k\ln(NI1/I2))*[(VGO/T-((VGO-VBEO(9))/T_0)+((m-1)k/q)\ln(To/T))] \quad (4)$$

Where "★" indicates multiplication. This expression for the sum of resistors R3 and RA, R3a, shows that the value which causes the circuit to trip at a given temperature is proportional to the resistor R6. This means that the absolute value of R6 can be adjusted by trimming so that resistors R3 and RA can be scaled to a particular value, despite some difference of the onchip resistors from unit to unit.

The factor following R6 in equation 4 is intended to be a constant. In practice, however, there may be some variation of the ratio of I2 to I1 and the area ratio factor n. Adjusting R6 can correct for the manufacturing variation in this factor as well.

The third factor of equation 4 contains the temperature sensitivity which is desired for the programming function. Unfortunately in addition to the number of known constants, it also contains $V_{BEO(9)}$ within the term. This means that an equation for the value of the sum of R3 and RA as a function of temperature will depend on the manufacturing variable $V_{BEO(9)}$. Setting resistance R3 equal to:

$$R3'=-(R6q/k\ln(NI1/I2)[((VG(0)-VBEO(9))/To)]$$

and resistance RA equal to $$RA'=-(R6q/k\ln(NI1/I2)[(VGO/To)+((m-1)k/q)\ln(To/T))]$$

The first of these resistances contains the $V_{BEO(9)}$ along with the collection of constants and the R6 factor, but is independent of temperature. The other resistance contains all the temperature dependent terms, along with another collection of constants and R6 normalizing factor. The format of the second expression is such that it could be the basis of a formula for RA versus desired trip temperature. Assuming that the value of m is invariant for any given process, and that $T_0$ can be fixed by choice, the second factor is a temperature function which is independent of any of the manufacturing variables and can be accurately predicted. The first factor consists of constants and factors selected for nominal value along with the R6 factor which can be trimmed to normalize the value of the expression at a single temperature.

The second, temperature dependent, factor in equation 6 contains a logarithmic function of temperature; its second term. This term is the same one that appears in the analysis of a bandgap reference, where it constitutes an error from perfect temperature invariance. In the case of equation 6 is not actually an error since to the extent that m is invariant, the term is a strict function of temperature. This term is relatively small and has a more or less simple form. It is a simple convex curve which looks vaguely hyperbolic. The first term of this factor, $V_{GO}$, is hyperbolic in T so that the possibility to approximate the second term by an adjustment of the first presents itself.

The expression for R3' of equation 6 is intrinsicly negative. By adding and subtracting the same value to R3' and from R3' respectively, the sum is unchanged but yields two new variables both of which can be positive. Adding $R_x$ to R3' and subtracting $R_x$ from R3' to give unprimed variables yields:

$$R3=Rx-(R6q/k\ln(NI1/I2)[((VG(0)-VBEO(9))/To)]$$

$$RA=(R6q/k\ln(NI1/I2)(VGO/(T+Tx))-Rx$$

The first of these transformations is exact while the second approximately satisfies equation 5. The approximation consists of the omission of the logarithmic term and the addition of $T_x$, and offsetting temperature constant. This simplifies the formula and contributes only a small error. These values are used to make the circuit and to determine the programming resistance. In a preferred embodiment, resistor RA is an external programming resistor.

Figure 2:
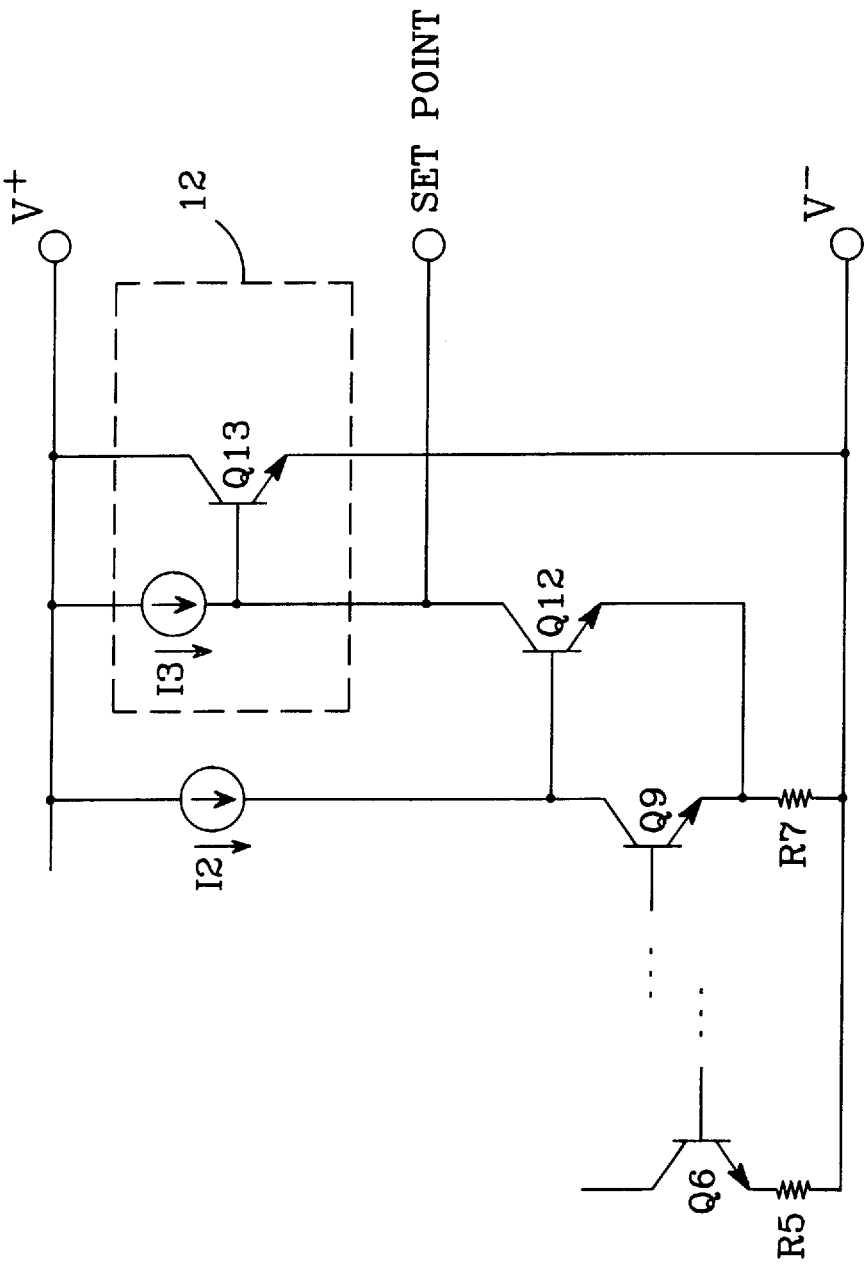
FIG. 2 is a more detailed circuit diagram of the adjustment portion of the trip point temperature sensor of FIG. 1.

FIG. 2 provides more detailed circuit diagram of the load 12. The load includes a follower driver transistor Q13 driven by a current I3. This current is made equal to current I2 so that the sum of currents I2 and I3 equals current I1. Below the trip temperature current I2 flows into the base of transistor Q12 turning it on. As a result, transistor Q12 takes all of current I3 at its collector, holding the base of transistor Q13 low. Ideally both currents I2 and I3 should be delivered by the emitter of transistor Q12 to resistor R7, a resistor omitted from FIG. 1 to simplify the figure. A corresponding resistor R5 in the emitter circuit of transistor Q6 will have most of current I2 flowing in it. Resistors R5 and R7 are made equal so that the voltage drop across R5 caused by current I1 should equal the drop across the resistor R7 due to the two currents I3 and I2. These currents and the resulting voltages are PTAT, and cause the base voltages of both transistors Q6 and Q9 to be displaced by this PTAT amount. This voltage is quantitatively the same as the voltage which would result from a different operating current density in both devices for a different value of $V_{BEO}$. When the trip temperature is reached, transistor Q9 will divert current I2 from the base of transistor Q12 causing it to begin switching off. As current is diverted from transistor Q12 towards the base of transistor Q13, the voltage drop across R7 will be reduced. This will increase the base emitter voltage applied to transistor Q9 causing it to increase its collector current. This will further reduce the drive to Q12, which will drop the emitter voltage of transistor Q9 further causing a greater increase in collector current, driving transistor Q12 further off. This positive feedback causes the circuit to switch regeneratively as it reaches the trip temperature where transistor Q9 takes all of current I2.

Once the switching occurs and current I3 is diverted to drive transistor Q13, the current in resistor R7 drops in half resulting in a PTAT difference in the emitter voltages of transistors Q6 and Q9. This equivalent to a change in the PTAT voltage which is required across resistor R6 to cause transistor Q9 to be on equilibrium, with current I2 flowing in its collector. In order for the base emitter voltage of transistor Q9 to fall so it will release some of current I2 and turn transistor Q12 back on, the voltage across R6 must increase. This will happen when the temperature falls by a small but controlled amount. When it does, transistor Q9 will reduce its collector current so that transistor Q12 will get some base drive. The resulting collector current will be conveyed to resistor R7, causing the emitter voltage of transistor Q9 to rise, further reducing the collector current of transistor Q9 and precipitating regenerative switching: this time from on to off. The block diagram of FIG. 3 illustrates the preferred combination of the set point circuit 10 in the controller 14. The set point circuit 10 is used as described above to generate a set point signal indicative of whether the circuit has exceeded a predetermined temperature. The controller, which may be a part of the same integrated circuit as the set point circuit 10, may use the set point signal to modify a control process for example, or to modify its own operation. That is, upon exceeding the set point temperature the controller may, for safety reasons, enter a low power operations state.

While particular embodiments for the invention have been shown and described, numerous variations and alternative embodiments will occur to those skilled in the art. Accordingly, it is intended that the invention be limited only in terms of the appended claims.

I claim:

1. A resistor programmable set point temperature circuit for indicating whether the temperature of a circuit meets or exceeds a set point temperature, comprising:

first and second supply voltage terminals, first and second bipolar transistors of like polarity, said second transistor having an emitter area N times that of the first transistor, the emitters of both transistors coupled to a common terminal, first and second current sources connected to provide predetermined currents I1 and I2, respectively, to the collectors of said transistors, a resistor divider coupled between said first and second supply voltage terminals, a first resistor of said divider connected between the bases of said first and second transistors such that the difference in base-emitter voltages of said first and second transistors appears across said resistor, and an output stage connected to receive current from said second current source.

2. The set point temperature circuit of claim 1, wherein said resistor divider further comprises:

second and third resistors connected in series between the base of said second transistor and said common terminal, said second resistor having a value approximately equal to $Rx-(R1q/kln(NI1/I2))(VGO-VBEO(9)/To)$, where R1 is the value of said first divider resistor, q is the electron charge, k is Boltzmann's constant, ln is the natural logarithm function, VGO is the bandgap voltage extrapolated to zero degrees Kelvin, Rx is a convenient resistor value chosen to produce a positive value for the resistance of the second resistor, and Tx is an offsetting temperature constant chosen to approximate $(VGO/T+((m-1)k/q)ln(To/T))by(VGO/T+Tx)$.

3. The set point temperature circuit of claim 2, wherein said third resistor is approximately equal to $(R1q/kln(NI1/I2))(VGO/T+Tx)-Rx$, where R1 is the value of said first divider resistor, q is the electron charge, k is Boltzmann's constant, ln is the natural logarithm function, VGO is the bandgap voltage extrapolated to zero degrees Kelvin, Rx is a convenient resistor value chosen to produce a positive value for the resistance of the second resistor, and Tx is an offsetting temperature constant chosen to approximate $(VGO/T+((m-1)k/q)ln(To/T))by(VGO/T+Tx)$.

* * * * *